(12) United States Patent
Wu

(10) Patent No.: US 12,575,297 B2
(45) Date of Patent: Mar. 10, 2026

(54) ENCAPSULATING COVER PLATE AND DISPLAY DEVICE

(71) Applicants: Wuhan China Star Optoelectronics Technology Co., Ltd., Wuhan (CN); Wuhan China Star Optoelectronics Semiconductor Display Technology Co., Ltd., Wuhan (CN)

(72) Inventor: Kailong Wu, Wuhan (CN)

(73) Assignees: Wuhan China Star Optoelectronics Technology Co., Ltd., Wuhan (CN); Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 671 days.

(21) Appl. No.: 17/288,988

(22) PCT Filed: Apr. 19, 2021

(86) PCT No.: PCT/CN2021/088149
§ 371 (c)(1),
(2) Date: Oct. 13, 2022

(87) PCT Pub. No.: WO2022/213418
PCT Pub. Date: Oct. 13, 2022

(65) Prior Publication Data
US 2024/0016035 A1 Jan. 11, 2024

(30) Foreign Application Priority Data

Apr. 6, 2021 (CN) .......................... 202110366682.8

(51) Int. Cl.
*H10K 59/80* (2023.01)
*H10K 102/00* (2023.01)

(52) U.S. Cl.
CPC ..... *H10K 59/871* (2023.02); *H10K 2102/311* (2023.02); *H10K 2102/351* (2023.02)

(58) Field of Classification Search
CPC ........... H10K 59/871; H10K 2102/311; H10K 2102/351; G06F 1/1652; G09F 9/301
See application file for complete search history.

(56) References Cited

U.S. PATENT DOCUMENTS

2012/0081874 A1 4/2012 Wu et al.
2017/0060188 A1 3/2017 Han et al.
(Continued)

FOREIGN PATENT DOCUMENTS

CN 106886253 A * 6/2017 ............... G06F 1/16
CN 106910823 6/2017
(Continued)

OTHER PUBLICATIONS

Cenglish Machine Translation of Deng CN106886253 (Year: 2025).*
(Continued)

*Primary Examiner* — Donald L Raleigh

(57) ABSTRACT

An encapsulating cover plate and a display device are provided. The encapsulating cover plate can protect a bending area of a display panel by disposing a first cover plate in the bending area, and can provide high-hardness protection to non-bending areas of the display panel by disposing second cover plates in the non-bending areas. Therefore, the encapsulating cover plate has dual characteristics of flexibility and ultra-high hardness, thereby ensuring the display panel to have effective protection and improving market competitiveness of the encapsulating cover plate at a same time.

20 Claims, 3 Drawing Sheets

(56) References Cited

U.S. PATENT DOCUMENTS

| | | |
|---|---|---|
| 2017/0062742 A1 | 3/2017 | Kim |
| 2018/0143353 A1 | 5/2018 | Kim et al. |
| 2019/0055151 A1 | 2/2019 | Heo et al. |
| 2019/0248098 A1 | 8/2019 | Ozeki et al. |
| 2020/0333845 A1 | 10/2020 | Yug et al. |

FOREIGN PATENT DOCUMENTS

| | | | | |
|---|---|---|---|---|
| CN | 207720549 | 8/2018 | | |
| CN | 108831307 | 11/2018 | | |
| CN | 110379306 | 10/2019 | | |
| CN | 110441943 | 11/2019 | | |
| CN | 110634404 | 12/2019 | | |
| CN | 110740202 | 1/2020 | | |
| CN | 110807991 | 2/2020 | | |
| CN | 110854177 | 2/2020 | | |
| CN | 210183377 | 3/2020 | | |
| CN | 210955909 | 7/2020 | | |
| CN | 210955909 U | * 7/2020 | .............. | G09F 9/30 |
| CN | 111756889 | 10/2020 | | |

OTHER PUBLICATIONS

Nglish Machine Translation of Tao et al CN210955909 (Year: 2025).*

Wang et al. "Progress and Prospects in Stretchable Electroluminescent Devices", Nanophotonics, 6(2): 435-451, Feb. 6, 2017. & English Abstract.

Zhang et al. "Current Situation and Development Trend of Glass Cover for Falt Panel Display Devices Such as TV Sets", Glass, p. 12-15, Nov. 30, 2020. & English Abstract.

* cited by examiner

ENCAPSULATING COVER PLATE AND DISPLAY DEVICE

RELATED APPLICATIONS

This application is a National Phase of PCT Patent Application No. PCT/CN2021/088149 having International filing date of Apr. 19, 2021, which claims the benefit of priority of Chinese Patent Application No. 202110366682.8 filed on Apr. 6, 2021. The contents of the above applications are all incorporated by reference as if fully set forth herein in their entirety.

FIELD AND BACKGROUND OF THE INVENTION

The present disclosure relates to the field of display panel technologies, and more particularly, to an encapsulating cover plate and a display device.

With development of flat display technologies, pursuit of display effect of displays is also getting higher. In recent years, major mobile phone and tablet manufacturers have launched flexible folding screen terminal devices, and users and the market are full of expectations for this new type of display screen technology. However, regarding two-way requirements for screen bending and screen protection, protective cover plates applying to flexible folding screens usually need to adopt a balanced strategy of a compromise between flexibility and hardness, but this will sacrifice a part of product reliability. Therefore, it is very important to develop a new type of protective cover plate technique to meet requirements of products.

Different from conventional protective cover plates, the protective cover plates of folding screens require bendability, so they need to simultaneously achieve both characteristics of flexibility and high hardness. At present, mainstream protective cover plates in markets use transparent polyimide (colorless polyimide, CPI) materials and ultra-thin glass (UTG) materials, but these two kinds of materials are single type of material and have expensive prices, and it is difficult to simultaneously achieve good flexibility and ultra-high hardness for these two kinds of materials. Therefore, it is necessary to develop a new cover plate technique to meet market demands.

Therefore, it is necessary to provide an encapsulating cover plate and a display device to solve problems above.

Technical problem: the present disclosure provides an encapsulating cover plate and a display device equipment to improve a technical problem of current encapsulating cover plates being unable to simultaneously achieve good flexibility and ultra-high hardness.

SUMMARY OF THE INVENTION

In order to solve the above problem, the present disclosure provides technical solutions as follows.

The present disclosure provides an encapsulating cover plate and a display device. The encapsulating cover plate includes at least one first cover plate and second cover plates disposed on both sides of the first cover plate and connected to the first cover plate; wherein, the first cover plate is disposed in a bending area, and the second cover plates are disposed in non-bending areas; and a hardness of the first cover plate is less than a hardness of the second cover plates.

In the encapsulating cover plate of the present disclosure, the first cover plate and the second cover plates form a concave-convex inter-embedded structure at junctions between the first cover plate and the second cover plates.

In the encapsulating cover plate of the present disclosure, the second cover plates are provided with a plurality of protrusions at the junctions adjacent to the first cover plate, and the first cover plate is defined with grooves corresponding to the protrusions on a surface of the junctions; and a hardness of the protrusions is greater than the hardness of the first cover plate and less than the hardness of the second cover plates.

In the encapsulating cover plate of the present disclosure, the grooves positioned on both ends of the first cover plate are staggered from each other.

In the encapsulating cover plate of the present disclosure, the encapsulating cover plate further includes a first flexible filling member and a second flexible filling member, wherein a thickness of the first cover plate is less than a thickness of the second cover plates, the first cover plate is connected to the first flexible filling member, and the second cover plates are connected to the second flexible filling member; and a sum of the thickness of the first cover plate and a thickness of the first flexible filling member is equal to a sum of the thickness of the second cover plates and a thickness of the second flexible filling member.

In the encapsulating cover plate of the present disclosure, the thickness of the first cover plate is greater than or equal to 30 μm and less than or equal to 60 μm, and the thickness of the second cover plates is greater than or equal to 200 μm and less than or equal to 300 μm.

In the encapsulating cover plate of the present disclosure, the first cover plate includes transparent polyimide, ultra-thin glass, or a stacked structure of transparent polyimide and ultra-thin glass.

In the encapsulating cover plate of the present disclosure, the second cover plates include a glass cover plate.

In the encapsulating cover plate of the present disclosure, the first cover plate and the second cover plates are connected to each other by an adhesive or thermal reshaping.

The present disclosure further provides a display device, which includes a display panel including at least one bending area and non-bending areas connected to the bending area; and the encapsulating cover plate mentioned above, wherein the first cover plate is disposed in the bending area of the display panel, and the second cover plates are disposed in the non-bending areas of the display panel.

In the display device of the present disclosure, the hardness of the first cover plate is less than the hardness of the second cover plates.

In the display device of the present disclosure, the first cover plate and the second cover plates form the concave-convex inter-embedded structure at the junctions between the first cover plate and the second cover plates.

In the display device of the present disclosure, the second cover plates are provided with the plurality of protrusions at the junctions adjacent to the first cover plate, and the first cover plate is defined with the grooves corresponding to the protrusions on the surface of the junctions; and the hardness of the protrusions is greater than the hardness of the first cover plate and less than the hardness of the second cover plates.

In the display device of the present disclosure, the grooves positioned on both ends of the first cover plate are staggered from each other.

In the display device of the present disclosure, the encapsulating cover plate further includes the first flexible filling member and the second flexible filling member, wherein the thickness of the first cover plate is less than the thickness of the second cover plates, the first cover plate is connected to the first flexible filling member, and the second cover plates are connected to the second flexible filling member; and the sum of the thickness of the first cover plate and the thickness of the first flexible filling member is equal to the sum of the thickness of the second cover plates and the thickness of the second flexible filling member.

In the display device of the present disclosure, the thickness of the first cover plate is greater than or equal to 30 μm and less than or equal to 60 μm, and the thickness of the second cover plates is greater than or equal to 200 μm and less than or equal to 300 μm.

In the display device of the present disclosure, the first flexible filling member includes acrylic plastic, and the second flexible filling member includes an optical adhesive.

In the display device of the present disclosure, the first cover plate includes transparent polyimide, ultra-thin glass, or the stacked structure of transparent polyimide and ultra-thin glass.

In the display device of the present disclosure, the second cover plates include the glass cover plate.

In the display device of the present disclosure, the first cover plate and the second cover plates are connected to each other by an adhesive or thermal reshaping.

Beneficial effect: the present disclosure designs the encapsulating cover plate as a composite cover plate by connecting the first cover plate and the second cover plates. The first cover plate is disposed in the bending area and is configured to protect the bending area of the display panel, and the second cover plates are disposed in the non-bending areas and are configured to provide high-hardness protection to the non-bending areas of the display panel. Therefore, the encapsulating cover plate has dual characteristics of flexibility and ultra-high hardness, which ensures the display panel to have effective protection, thereby being uneasy to develop cracks and reducing a risk of causing the display panel to lose effectiveness due to the cracks.

In addition, since the encapsulating cover plate has advantages of bendability and high hardness, market competitiveness of the encapsulating cover plate and reliability of the display device can be improved.

DESCRIPTION OF SPECIFIC EMBODIMENTS OF THE INVENTION

Figure 1:
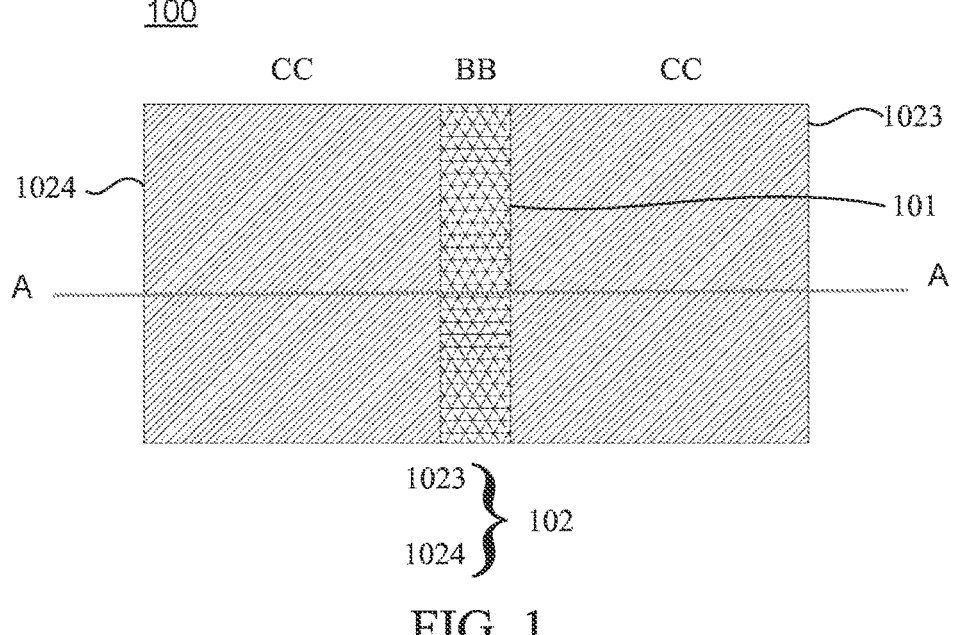
FIG. 1 is a first top view of an encapsulating cover plate according to an embodiment of the present disclosure.

The present disclosure provides an encapsulating cover plate and a display device. In order to make the purpose, technical solutions, and effects of this disclosure clearer and more definite, the following further describes this disclosure in detail with reference to the drawings and embodiments. It should be understood that the specific embodiments described herein are only used to explain the disclosure, and are not used to limit the disclosure.

In current encapsulating cover plates, flexible folding screens usually adopt a balanced strategy of a compromise between flexibility and hardness. That is, in order to have foldability, the current encapsulating cover plates generally use single transparent polyimide or ultra-thin glass, thereby causing impact resistance of flexible encapsulating cover plates to be insufficient and making flexible display devices vulnerable to damage. The embodiments of the present disclosure are used to solve this problem.

Referring to FIGS. 1 to 8, the present disclosure provides the encapsulating cover plate 100, which includes at least one first cover plate 101 and second cover plates 102 disposed on both sides of the first cover plate 101 and connected to the first cover plate 101. The first cover plate 101 is disposed in a bending area BB, and the second cover plates 102 are disposed in non-bending areas CC. Wherein, a hardness of the first cover plate 101 is less than a hardness of the second cover plates 102.

The present disclosure designs the encapsulating cover plate 100 as a composite cover plate by connecting the first cover plate 101 and the second cover plates 102. The first cover plate 101 is disposed in the bending area BB and is configured to protect a bending area BB of a display panel, and the second cover plates 102 are disposed in the non-bending areas CC and are configured to provide high-hardness protection to non-bending areas CC of the display panel. Therefore, the encapsulating cover plate 100 has dual characteristics of flexibility and ultra-high hardness, which ensures the display panel to have effective protection, thereby being uneasy to develop cracks and reducing a risk of causing the display panel to lose effectiveness due to the cracks. In addition, since the encapsulating cover plate 100 has advantages of bendability and high hardness, market competitiveness of the encapsulating cover plate 100 can be improved.

Specific embodiments are used to describe technical solutions of the present disclosure.

Referring to FIGS. 1 to 5, the present disclosure provides the encapsulating cover plate 100, which includes the at least one first cover plate 101 and the second cover plates 102 disposed on both sides of the first cover plate 101 and connected to the first cover plate 101. The first cover plate 101 is disposed in the bending area BB, and the second cover plates 102 are disposed in the non-bending areas CC. Wherein, the hardness of the first cover plate 101 is less than the hardness of the second cover plates 102.

In an embodiment, the encapsulating cover plate 100 includes the bending area BB and the non-bending area CC. The first cover plate 101 is disposed in the bending area BB and has bendability, thereby protecting the bending area BB of the display panel and making the display panel uneasy to develop cracks during bending. The second cover plates 102 are disposed in the non-bending areas CC and have high hardness, thereby protecting the non-bending areas CC of the display panel and improving impact resistance in the non-bending areas CC of a flexible display device.

Referring to FIG. 1, in an embodiment, the encapsulating cover plate 100 includes one first cover plate 101 and the second cover plates 102 connected to the first cover plate 101, the second cover plates 102 include a third cover plate 1023 and a fourth cover plate 1024 disposed opposite to each other, the first cover plate 101 is disposed between the third cover plate 1023 and the fourth cover plate 1024, and the third cover plate 1023 and the fourth cover plate 1024 are connected to the first cover plate 101. Wherein, the hardness of the first cover plate 101 is less than the hardness of the second cover plates 102, that is, the encapsulating cover plate 100 of the flexible display device uses materials having opposite hardnesses in the bending area BB and the non-bending areas CC. Using an encapsulating structure having a soft and hard combination allows corresponding areas of the flexible display device to have protection in a greatest extent, thereby improving a service life of the display device.

In an embodiment, the encapsulating cover plate 100 is arranged alternatingly by one first cover plate 101 and one second cover plate 102. A shape of the encapsulating cover plate 100 may be circular, rectangular, or other polygon, and is not specifically limited herein.

Figure 2:
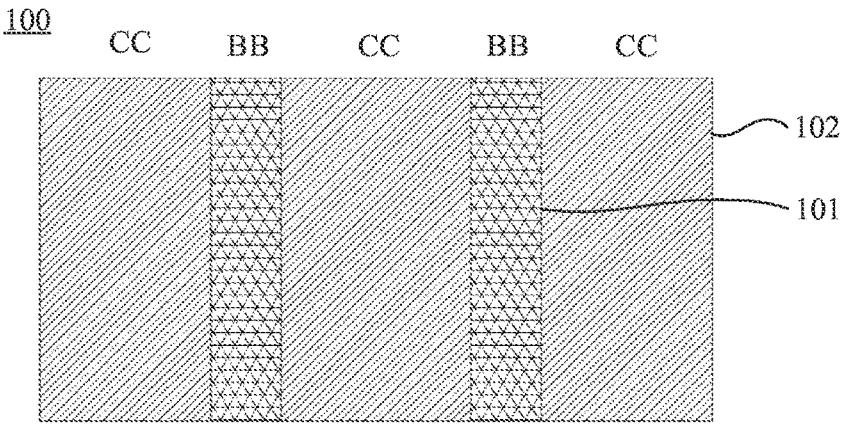
FIG. 2 is a second top view of the encapsulating cover plate according to an embodiment of the present disclosure.

Referring to FIGS. 1 and 2, the encapsulating cover plate 100 can not only include one bending area BB and two non-bending areas CC, but also include two bending areas BB and three non-bending areas CC. That is, a number of the first cover plate 101 is at least one, a number of the second cover plates 102 is at least two, and the first cover plate 101 and the second cover plates 102 are disposed alternatingly to form the encapsulating cover plate 100. The numbers of the first cover plate 101 and the second cover plates 102 are decided according to numbers of the bending area BB and the non-bending areas CC of the display panel, and are not specifically limited herein.

Figure 3:
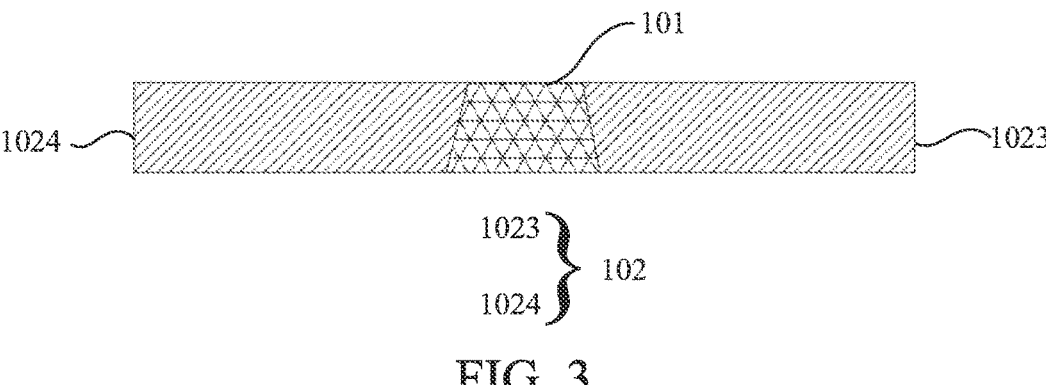
FIG. 3 is a first schematic cross-sectional diagram along an A-A direction in FIG. 1.
Figure 4:
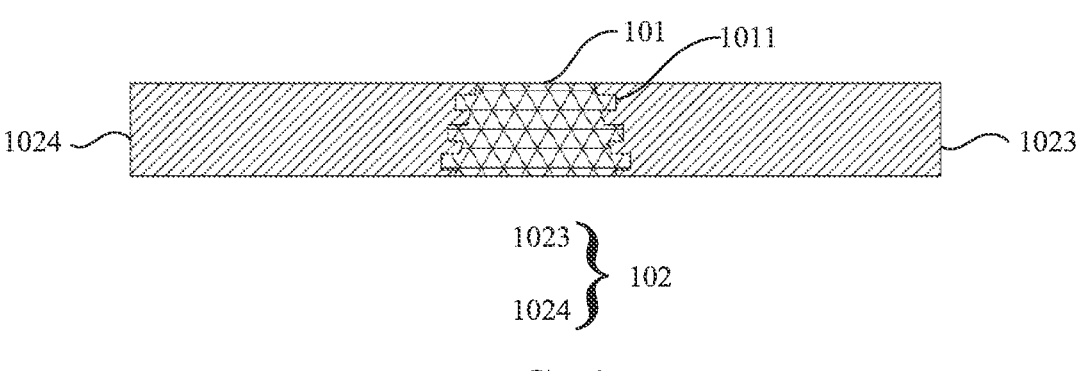
FIG. 4 is a second schematic cross-sectional diagram along the A-A direction in FIG. 1.
Figure 5:
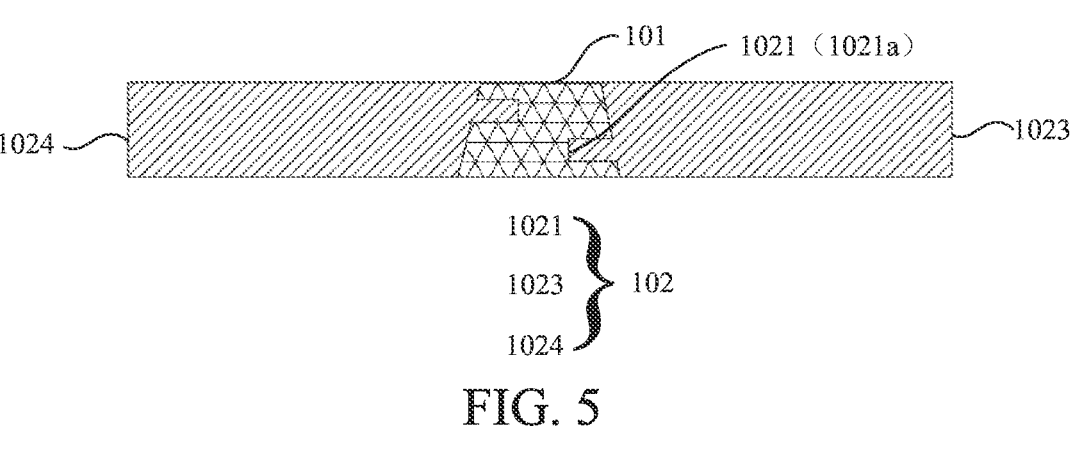
FIG. 5 is a third schematic cross-sectional diagram along the A-A direction in FIG. 1.

Referring to FIGS. 3 to 5, a thickness of the first cover plate 101 is same as a thickness of the second cover plates 102, and a cross-sectional shape of the first cover plate 101 is trapezoidal, thereby improving operability of connecting the first cover plate 101 and the second cover plates 102 and improving reliability of connections between the first cover plate 101 and the second cover plates 102.

In an embodiment, the first cover plate 101 uses a flexible material, which includes transparent polyimide, ultra-thin glass, or a stacked structure of both transparent polyimide and ultra-thin glass. The second cover plates 102 disposed on both sides of the first cover plate 101 use a glass material having higher stiffness, which includes a glass cover plate. The first cover plate 101 and the second cover plates 102 are connected to each other by an adhesive or thermal reshaping. When the first cover plate 101 uses transparent polyimide, transition areas between the first cover plate 101 and the second cover plates 102 can be bonded by a chemical adhesive or an optical adhesive, and then processed and leveled. Compared to current technology, the first cover plate 101 and the second cover plates 102 disposed on both sides of the first cover plate 101 of this embodiment can be fixed by a complete machine model with a high temperature setting glue, which is easy to operate and improves attachment stability. When the first cover plate 101 uses ultra-thin glass, interfaces between the first cover plate 101 and the second cover plates 102 can be welded together, and then processed and leveled.

In an embodiment, the first cover plate 101 and the second cover plates 102 form a concave-convex inter-embedded structure at junctions thereof. Specifically, the second cover plates 102 are defined with a plurality of grooves 1011 at the junctions between the first cover plate 101 and the second cover plates 102. The flexible material of the first cover plate 101 extends to the grooves 1011 and allows the first cover plate 101 and the second cover plates 102 to form the concave-convex inter-embedded structure at the junctions, which increases a contact area between the first cover plate 101 and the second cover plates 102 at the junctions, thereby improving stability of connections between the non-bending areas CC and the bending area BB. The second cover plates 102 can also share a portion of bending stresses when the display panel is bent, thereby reducing a probability of developing cracks due to bending the first cover plate 101.

In an embodiment, a cross-sectional shape of the grooves 1011 may be triangular, rectangular, or other polygon, and is not specifically limited herein.

In an embodiment, the second cover plates 102 are provided with a plurality of protrusions 1021 at the junctions adjacent to the first cover plate 101, and the first cover plate 101 is defined with grooves 1021a corresponding to the protrusions 1021 on a surface of the junctions. Wherein, a hardness of the protrusions 1021 is greater than the hardness of the first cover plate 101 and less than the hardness of the second cover plates 102. Specifically, the second cover plates 102 are provided with the plurality of protrusions 1021 at the junctions between the first cover plate 101 and the second cover plates 102, and the hardness of the protrusions 1021 is less than a hardness in other areas of the second cover plates 102 and greater than the hardness of the first cover plate 101. When the display panel is bent under forces, since the hardness of the protrusions 1021 is between the hardness of the first cover plate 101 and the hardness in other areas of the second cover plates 102 and the protrusions 1021 are positioned at the junctions between the first cover plate 101 and the second cover plates 102, a force undergone by the protrusions 1021 is less than a force undergone by the first cover plate 101. Therefore, the protrusions 1021 can share a portion of bending stresses for the first cover plate 101 and are uneasy to develop cracks, thereby improving overall encapsulating performance of the encapsulating cover plate 100.

In an embodiment, the grooves 1021a defined at both ends of the first cover plate 101 are staggered from each other. That is, the second cover plates 102 include the third cover plate 1023 and the fourth cover plate 1024 disposed opposite to each other, the third cover plate 1023 is provided with a first protrusion 1021, the fourth cover plate 1024 is provided with a second protrusion 1021, and the first protrusion 1021 and the second protrusion 1021 are staggered from each other. Specifically, when the display panel has two non-bending areas CC, the second cover plates 102 include the third cover plate 1023 and the fourth cover plate 1024 disposed opposite to each other, the third cover plate 1023 is provided with a plurality of first protrusions 1021, the fourth cover plate 1024 is provided with a plurality of second protrusions 1021, and the first protrusions 1021 and the second protrusions 1021 are staggered from each other, which allows the encapsulating cover plate 100 to have enough flexible material to be connected to the second cover plates 102 by each of the protrusions 1021 at the junctions between the first cover plate 101 and the second cover plates 102, thereby preventing the second cover plates 102 opposite to each other from disposing two opposite protrusions 1021 at a same time. Since the flexible material between the two opposite protrusions 1021 is insufficient to share the bending stresses undergone by the display panel, the cracks will develop and the service life of the display device will be reduced.

Figure 6:
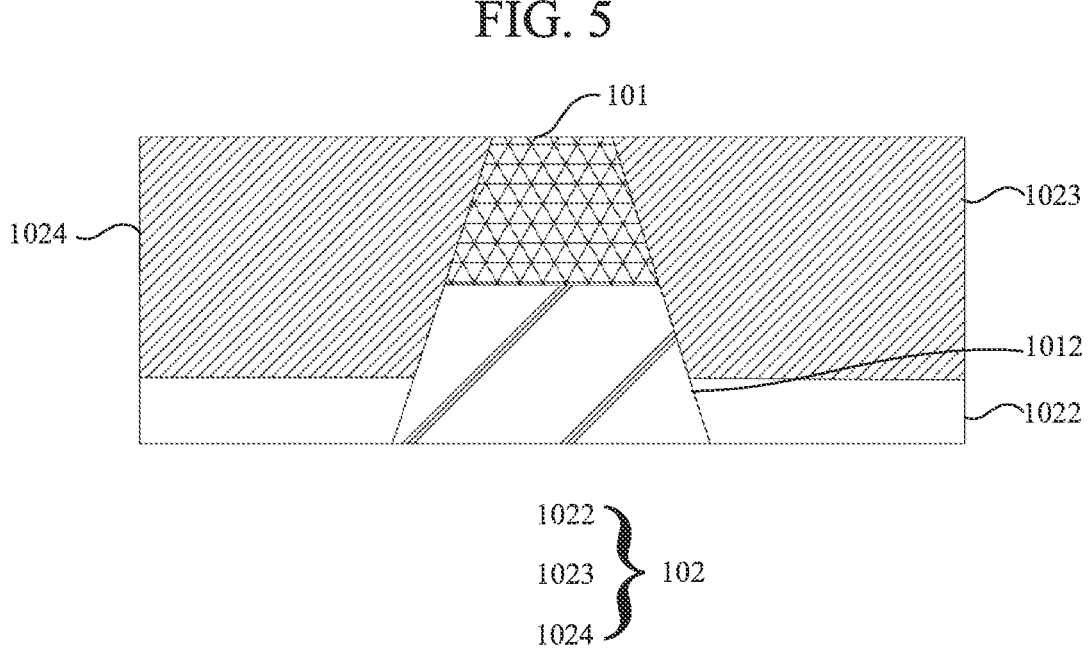
FIG. 6 is a fourth schematic cross-sectional diagram along the A-A direction in FIG. 1.
Figure 7:
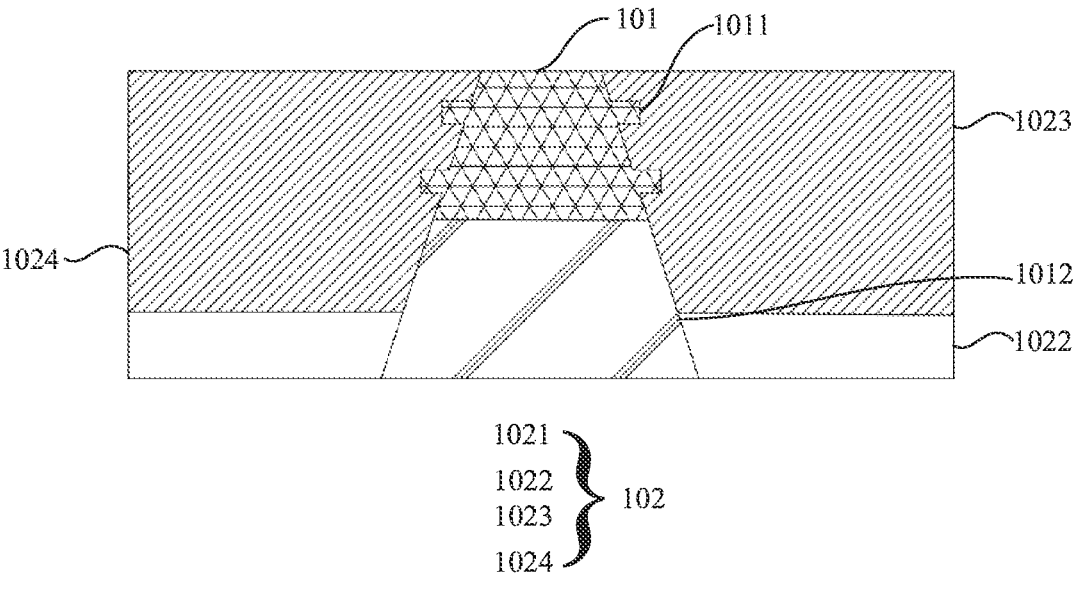
FIG. 7 is a fifth schematic cross-sectional diagram along the A-A direction in FIG. 1.
Figure 8:
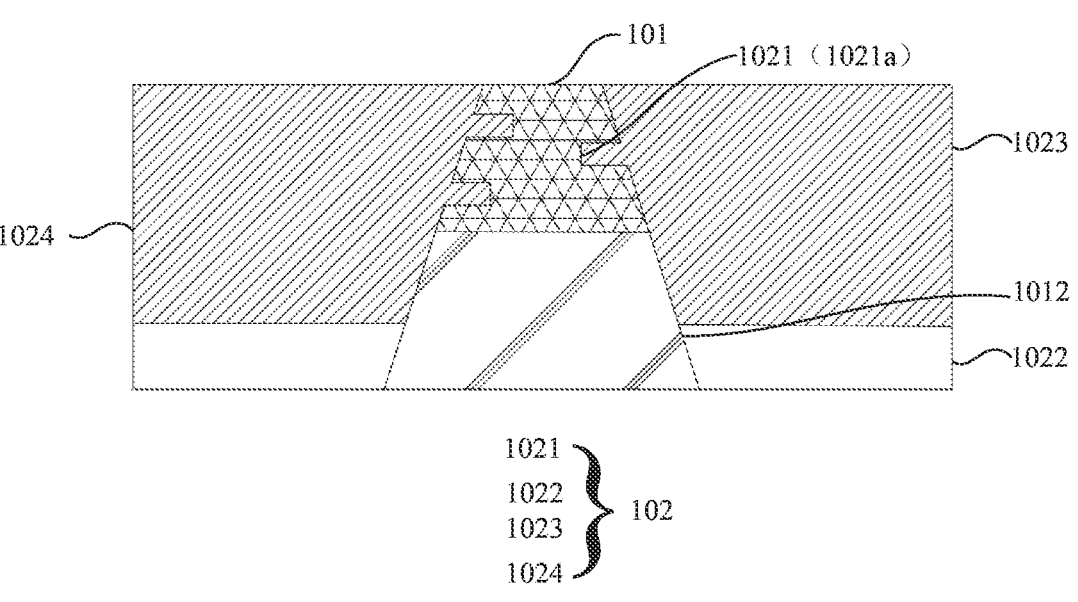
FIG. 8 is a sixth schematic cross-sectional diagram along the A-A direction in FIG. 1.

Referring to FIGS. 6 to 8, the encapsulating cover plate 100 further includes a first flexible filling member 1012 and a second flexible filling member 1022, a thickness of the first cover plate 101 is less than a thickness of the second cover plates 102, the first cover plate 101 is connected to the first flexible filling member 1012, and the second cover plates 102 are connected to the second flexible filling member 1022. A sum of the thickness of the first cover plate 101 and a thickness of the first flexible filling member 1012 is equal to a sum of the thickness of the second cover plates 102 and a thickness of the second flexible filling member 1022. In other words, a surface of the first cover plate 101 away from the display panel and a surface of the second cover plates 102 away from the display panel are positioned at a same height.

Specifically, in order to ensure the surface of the first cover plate 101 away from the display panel and the surface of the second cover plates 102 away from the display panel being positioned at the same height, that is, the first cover plate 101 and the second cover plates 102 are on a same plane in the display device, when the thickness of the first cover plate 101 is less than the thickness of the second cover plates 102, the first cover plate 101 in the bending area BB is connected to the bending area BB of the display panel by the first flexible filling member 1012, and the second cover plates 102 are connected to the non-bending areas CC of the display panel by the second flexible filling member 1022. That is, the sum of the thickness of the first cover plate 101 and the thickness of the first flexible filling member 1012 is equal to the sum of the thickness of the second cover plates 102 and the thickness of the second flexible filling member 1022, which ensures the first cover plate 101 and the second cover plates 102 are on a same level, and lays a foundation for preparation of flexible display devices with flat display screens.

In an embodiment, the thickness of the first cover plate 101 is greater than or equal to 30 μm and less than or equal to 60 μm, and the thickness of the second cover plates 102 is greater than or equal to 200 μm and less than or equal to 300 μm.

In an embodiment, the first flexible filling member 1012 includes acrylic plastic, and the second flexible filling member 1022 includes an optical adhesive.

The present disclosure further provides the display device, which includes the display panel and the encapsulating cover plate 100. The display panel includes at least one bending area BB and the non-bending areas CC connected to the bending area BB. The encapsulating cover plate 100 includes the first cover plate 101 and the second cover plates 102, the first cover plate 101 is disposed in the bending area BB of the display panel, and the second cover plates 102 are disposed in the non-bending areas CC of the display panel.

In an embodiment, the hardness of the first cover plate 101 is less than the hardness of the second cover plates 102. The encapsulating cover plate 100 includes the bending area BB and the non-bending area CC. The first cover plate 101 is disposed in the bending area BB and has bendability, thereby protecting the bending area BB of the display panel and making the display panel uneasy to develop cracks during bending. The second cover plates 102 are disposed in the non-bending areas CC and have high hardness, thereby protecting the non-bending areas CC of the display panel and improving the impact resistance in the non-bending areas CC of the flexible display device. Therefore, market competitiveness of the display device can be improved.

In an embodiment, in the display device, the first cover plate 101 and the second cover plates 102 of the encapsulating cover plate 100 form the concave-convex inter-embedded structure at the junctions thereof. Specifically, the second cover plates 102 are defined with the plurality of grooves 1011 at the junctions between the first cover plate

101 and the second cover plates 102. The flexible material of the first cover plate 101 extends to the grooves 1011 and allows the first cover plate 101 and the second cover plates 102 to form the concave-convex inter-embedded structure at the junctions, which increases the contact area between the first cover plate 101 and the second cover plates 102 at the junctions, thereby improving the stability of connections between the non-bending areas CC and the bending area BB. The second cover plates 102 can also share a portion of bending stresses when the display panel is bent, thereby reducing the probability of developing cracks due to bending the first cover plate 101.

In an embodiment, in the display device, the second cover plates 102 are provided with the plurality of protrusions 1021 at the junctions adjacent to the first cover plate 101, and the first cover plate 101 is defined with the grooves 1021a corresponding to the protrusions 1021 on the surface of the junctions. The hardness of the protrusions 1021 is greater than the hardness of the first cover plate 101 and less than the hardness of the second cover plates 102. Specifically, the second cover plates 102 are provided with the plurality of protrusions 1021 at the junctions between the first cover plate 101 and the second cover plates 102, and the hardness of the protrusions 1021 is less than the hardness in other areas of the second cover plates 102 and greater than the hardness of the first cover plate 101. When the display panel is bent under forces, since the hardness of the protrusions 1021 is between the hardness of the first cover plate 101 and the hardness in other areas of the second cover plates 102 and the protrusions 1021 are positioned at the junctions between the first cover plate 101 and the second cover plates 102, the force undergone by the protrusions 1021 is less than the force undergone by the first cover plate 101. Therefore, the protrusions 1021 can share a portion of bending stresses for the first cover plate 101 and are uneasy to develop cracks, thereby improving overall encapsulating performance of the encapsulating cover plate 100.

In an embodiment, in the display device, the grooves 1021a defined at both ends of the first cover plate 101 are staggered from each other. That is, the second cover plates 102 include the third cover plate 1023 and the fourth cover plate 1024 disposed opposite to each other, the third cover plate 1023 is provided with the first protrusion 1021, the fourth cover plate 1024 is provided with the second protrusion 1021, and the first protrusion 1021 and the second protrusion 1021 are staggered from each other. Specifically, when the display panel has the two non-bending areas CC, the second cover plates 102 include the third cover plate 1023 and the fourth cover plate 1024 disposed opposite to each other, the third cover plate 1023 is provided with the plurality of first protrusions 1021, the fourth cover plate 1024 is provided with the plurality of second protrusions 1021, and the first protrusions 1021 and the second protrusions 1021 are staggered from each other, which allows the encapsulating cover plate 100 to have enough flexible material to be connected to the second cover plates 102 by each of the protrusions 1021 at the junctions between the first cover plate 101 and the second cover plates 102, thereby preventing the second cover plates 102 opposite to each other from disposing two opposite protrusions 1021 at the same time. Since the flexible material between the two opposite protrusions 1021 is insufficient to share the bending stresses undergone by the display panel, the cracks will develop and the service life of the display device will be reduced.

In an embodiment, in the display device, the thickness of the first cover plate 101 is less than or equal to the thickness of the second cover plate 102. Specifically, when the thickness of the first cover plate 101 is equal to the thickness of the second cover plates 102, the first cover plate 101 and the second cover plates 102 are connected to the bending area BB and the non-bending areas CC corresponding to the display panel by glues having a same thickness. When the thickness of the first cover plate 101 is less than the thickness of the second cover plates 102, the first cover plate 101 is connected to the bending area BB of the display panel by the first flexible filling member 1012, and the second cover plates 102 are connected to the non-bending areas CC of the display panel by the second flexible filling member 1022.

In an embodiment, in the display device, the encapsulating cover plate 100 further includes the first flexible filling member 1012 and the second flexible filling member 1022, the thickness of the first cover plate 101 is less than the thickness of the second cover plates 102, the first cover plate 101 is connected to the first flexible filling member 1012, and the second cover plates 102 are connected to the second flexible filling member 1022. That is, when the first cover plate 101 and the second cover plates 102 are attached to corresponding areas of the display panel, the first cover plate 101 and the second cover plates 102 are attached to the bending area BB and the non-bending areas CC of the display panel by the first flexible filling member 1012 and the second flexible filling member 1022, respectively. The sum of the thickness of the first cover plate 101 and the thickness of the first flexible filling member 1012 is equal to the sum of the thickness of the second cover plates 102 and the thickness of the second flexible filling member 1022. The surface of the first cover plate 101 away from the display panel and the surface of the second cover plates 102 away from the display panel are positioned at the same height, which ensures the first cover plate 101 and the second cover plates 102 are on the same level, and lays the foundation for the preparation of flexible display devices with flat display screens.

In an embodiment, in the display device, the thickness of the first cover plate 101 is greater than or equal to 30 μm and less than or equal to 60 μm, and the thickness of the second cover plates 102 is greater than or equal to 200 μm and less than or equal to 300 μm.

In an embodiment, in the display device, the first cover plate 101 and the second cover plates 102 are connected to each other by the adhesive or thermal reshaping.

In an embodiment, in the display device, the first cover plate 101 includes transparent polyimide, ultra-thin glass, or the stacked structure of both transparent polyimide and ultra-thin glass.

In an embodiment, in the display device, the second cover plates 102 include the glass cover plate.

In an embodiment, in the display device, the first flexible filling member 1012 includes acrylic plastic, and the second flexible filling member 1022 includes the optical adhesive.

The present disclosure provides the encapsulating cover plate and the display device. The encapsulating cover plate includes the at least one first cover plate and the second cover plates disposed on both sides of the first cover plate and connected to the first cover plate. The first cover plate is disposed in the bending area, and the second cover plates are disposed in the non-bending areas. Wherein, the hardness of the first cover plate is less than the hardness of the second cover plates. The present disclosure designs the encapsulating cover plate as a composite cover plate by connecting the first cover plate and the second cover plates. The first cover plate is disposed in the bending area and is configured to protect the bending area of the display panel, and the second cover plates are disposed in the non-bending areas and are configured to provide high-hardness protection to the non-bending areas of the display panel. Therefore, the encapsulating cover plate has dual characteristics of flexibility and ultra-high hardness, which ensures the display panel to have effective protection, thereby being uneasy to develop cracks and reducing a risk of causing the display panel to lose effectiveness due to the cracks. In addition, since the encapsulating cover plate has advantages of bendability and high hardness, the market competitiveness of the encapsulating cover plate can be improved.

In the above embodiments, the description of each embodiment has its own emphasis. For a part that is not described in detail in an embodiment, refer to the related descriptions of other embodiments.

The encapsulating cover plate and the display device provided by the present disclosure are described in detail above. The specific examples are applied in the description to explain the principle and implementation of the disclosure. The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. An encapsulating cover plate, comprising at least one first cover plate, and second cover plates disposed on both sides of the first cover plate and connected to the first cover plate; wherein the first cover plate is disposed in a bending area, and the second cover plates are disposed in non-bending areas; a hardness of the first cover plate is less than a hardness of the second cover plates; and the first cover plate and the second cover plates form a concave-convex inter-embedded structure at junctions between the first cover plate and the second cover plates.

2. The encapsulating cover plate according to claim 1, wherein the second cover plates comprise a third cover plate and a fourth cover plate disposed opposite to each other, the first cover plate is disposed between the third cover plate and the fourth cover plate, and the third cover plate and the fourth cover plate are connected to the first cover plate.

3. The encapsulating cover plate according to claim 1, wherein the second cover plates are provided with a plurality of protrusions at the junctions adjacent to the first cover plate, and the first cover plate is defined with grooves corresponding to the protrusions on a surface of the junctions; and a hardness of the protrusions is greater than the hardness of the first cover plate and less than the hardness of the second cover plates.

4. The encapsulating cover plate according to claim 3, wherein the grooves positioned on both ends of the first cover plate are staggered from each other.

5. An encapsulating cover plate, comprising at least one first cover plate, second cover plates disposed on both sides of the first cover plate and connected to the first cover plate, a first flexible filling member, and a second flexible filling member, wherein the first cover plate is disposed in a bending area, and the second cover plates are disposed in non-bending areas; and a hardness of the first cover plate is less than a hardness of the second cover plates;

a thickness of the first cover plate is less than a thickness of the second cover plates, the first cover plate is connected to the first flexible filling member, and the second cover plates are connected to the second flexible filling member; and a sum of the thickness of the first cover plate and a thickness of the first flexible filling member is equal to a sum of the thickness of the second cover plates and a thickness of the second flexible filling member.

6. The encapsulating cover plate according to claim 5, wherein the thickness of the first cover plate ranges from 30 µm to 60 µm, and the thickness of the second cover plates ranges from 200 µm to 300 µm.

7. The encapsulating cover plate according to claim 1, wherein the first cover plate comprises transparent polyimide, ultra-thin glass, or a stacked structure of transparent polyimide and ultra-thin glass.

8. The encapsulating cover plate according to claim 1, wherein the second cover plates comprise a glass cover plate.

9. The encapsulating cover plate according to claim 1, wherein the first cover plate and the second cover plates are connected to each other by an adhesive or thermal reshaping.

10. A display device, comprising:

a display panel comprising at least one bending area and non-bending areas connected to the bending area; and an encapsulating cover plate comprising at least one first cover plate, and second cover plates disposed on both sides of the first cover plate and connected to the first cover plate, wherein the first cover plate is disposed in the bending area of the display panel, the second cover plates are disposed in the non-bending areas of the display panel, and the first cover plate and the second cover plates form a concave-convex inter-embedded structure at junctions between the first cover plate and the second cover plates.

11. The display device according to claim 10, wherein a hardness of the first cover plate is less than a hardness of the second cover plates.

12. The display device according to claim 10, wherein the second cover plates comprise a third cover plate and a fourth cover plate disposed opposite to each other, the first cover plate is disposed between the third cover plate and the fourth cover plate, and the third cover plate and the fourth cover plate are connected to the first cover plate.

13. The display device according to claim 10, wherein the second cover plates are provided with a plurality of protrusions at the junctions adjacent to the first cover plate, and the first cover plate is defined with grooves corresponding to the protrusions on a surface of the junctions; and a hardness of the protrusions is greater than the hardness of the first cover plate and less than the hardness of the second cover plates.

14. The display device according to claim 13, wherein the grooves positioned on both ends of the first cover plate are staggered from each other.

15. The display device according to claim 11, wherein the encapsulating cover plate further comprises a first flexible filling member and a second flexible filling member, a thickness of the first cover plate is less than a thickness of the second cover plates, the first cover plate is connected to the first flexible filling member, and the second cover plates are connected to the second flexible filling member; and a sum of the thickness of the first cover plate and a thickness of the first flexible filling member is equal to a sum of the thickness of the second cover plates and a thickness of the second flexible filling member.

16. The display device according to claim 15, wherein the thickness of the first cover plate ranges from 30 µm to 60 µm, and the thickness of the second cover plates ranges from 200 µm to 300 µm.

17. The display device according to claim 15, wherein the first flexible filling member comprises acrylic plastic, and the second flexible filling member comprises an optical adhesive.

18. The display device according to claim 11, wherein the first cover plate comprises transparent polyimide, ultra-thin glass, or a stacked structure of transparent polyimide and ultra-thin glass.

19. The display device according to claim 11, wherein the second cover plates comprise a glass cover plate.

20. The display device according to claim 11, wherein the first cover plate and the second cover plates are connected to each other by an adhesive or thermal reshaping.

\* \* \* \* \*